US009585259B1

(12) United States Patent
Reynov et al.

(10) Patent No.: US 9,585,259 B1
(45) Date of Patent: *Feb. 28, 2017

(54) APPARATUS AND METHODS FOR PLACEMENT OF DISCRETE COMPONENTS ON INTERNAL PRINTED CIRCUIT BOARD LAYERS

(71) Applicant: Juniper Networks, Inc., Sunnyvale, CA (US)

(72) Inventors: Boris Reynov, Cupertino, CA (US); Oscar Diaz-Landa, San Jose, CA (US); Shreeram Siddhaye, Sunnyvale, CA (US); Chebrolu S. Srinivas, San Jose, CA (US); Lee M. Forbes, Gilroy, CA (US); Mark Simpson, Cupertino, CA (US); Mark Devenport, Los Altos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/926,511

(22) Filed: Oct. 29, 2015

Related U.S. Application Data

(63) Continuation of application No. 13/956,079, filed on Jul. 31, 2013, now Pat. No. 9,185,794.

(51) Int. Cl.
*H05K 1/18* (2006.01)
*H05K 3/32* (2006.01)
*H05K 1/02* (2006.01)
*H05K 3/00* (2006.01)

(52) U.S. Cl.
CPC ............. *H05K 3/32* (2013.01); *H05K 1/0218* (2013.01); *H05K 1/183* (2013.01); *H05K 3/0011* (2013.01)

(58) Field of Classification Search
CPC ............. H01L 2224/16; H01L 2924/14; H01L 2924/15311; H01L 23/5389; H05K 1/182; H05K 1/0231; H05K 1/162
USPC ........ 361/760, 761, 763–764, 766, 780, 782; 174/260, 261
See application file for complete search history.

(56) References Cited

U.S. PATENT DOCUMENTS

| | | | |
|---|---|---|---|
| 6,442,043 B1 | 8/2002 | Seki et al. | |
| 6,487,083 B1 | 11/2002 | Kwong | |
| 7,102,085 B2 | 9/2006 | Ohta et al. | |
| 8,345,433 B2 * | 1/2013 | White | H01L 21/4857 361/761 |
| 2004/0022038 A1 | 2/2004 | Figueroa et al. | |
| 2006/0043606 A1 * | 3/2006 | Imaoka | H01L 23/5389 257/780 |
| 2006/0066417 A1 * | 3/2006 | Yamanaga | H01P 5/02 333/33 |
| 2010/0039784 A1 | 2/2010 | Hayashi | |
| 2010/0073894 A1 | 3/2010 | Mortensen et al. | |

(Continued)

*Primary Examiner* — Hoa C Nguyen
(74) *Attorney, Agent, or Firm* — Cooley LLP

(57) ABSTRACT

A printed circuit board (PCB) defines a first outer surface and a second outer surface that is opposite the first outer surface. The first outer surface of the PCB defines a recess. The PCB includes a signal layer between the first outer surface and the second surface with a first portion exposed within the recess and a second portion exposed within the recess. A component is disposed within the recess and connected to the first portion and the second portion of the signal layer such that an entirety of the component is within the recess and below the first surface.

20 Claims, 7 Drawing Sheets

(56) References Cited

U.S. PATENT DOCUMENTS

| | | |
|---|---|---|
| 2012/0000700 A1 | 1/2012 | Liu et al. |
| 2012/0024583 A1 | 2/2012 | Lee et al. |
| 2013/0062105 A1* | 3/2013 | Howard ............... H05K 1/0253 174/257 |
| 2014/0049929 A1 | 2/2014 | Yamaguchi |

* cited by examiner

APPARATUS AND METHODS FOR PLACEMENT OF DISCRETE COMPONENTS ON INTERNAL PRINTED CIRCUIT BOARD LAYERS

CROSS-REFERENCE TO RELATED APPLICATIONS

This application is a continuation of U.S. patent application Ser. No. 13/956,079 entitled, "Apparatus and Methods for Placement of Discrete Components on Internal Printed Circuit Board Layers," filed Jul. 31, 2013, the disclosure of which is incorporated herein by reference in its entirety.

BACKGROUND

Embodiments described herein relate generally to the placement of electrical components on a printed circuit board, and more particularly, subsurface mounting of discrete electrical components on internal printed circuit boards layers.

Some known electronic devices manufactured for high-speed signal transfer (e.g., greater than 10 Gigabits per second Gb/s) use printed circuit boards (PCBs) having dielectric materials with specific characteristics. Often, such dielectric materials are configured to minimize losses, thereby facilitating the high-speed signal transfer. Such known dielectric materials are typically expensive, at times being five to seven times the cost of a standard, commonly used PCB substrate (e.g., FR-4). As such, the efficient use of space on the PCBs is desirable.

Often, such PCBs have differential pairs and/or impedance-controlled strips (e.g., a transmission line such as a microstrip and/or stripline) to minimize impedance mismatches that can result in signal degradation. In some known high-speed applications, it may be desirable to use, for example, serial capacitors (i.e., alternating current (AC) capacitors) to provide AC isolation between a transmitter component and a receiver component on a PCB. Such capacitors, however, can introduce a characteristic impedance mismatch into the circuit. As such, the PCBs often employ signal vias to provide connectivity to internal layers of the PCB, which generally are back drilled to reduce the via stub. Moreover, the signal vias can degrade signal quality by increasing loss and/or cross-talk, as well as having parasitic resonances. In an effort to minimize these effects, the PCBs often include several ground vias to provide return signal paths, improve characteristic impedance mismatches, and reduce or eliminate signal-via-to-signal-via cross-talk. The inclusion of several ground vias, however, reduces the usable space of the PCB (e.g., portions of signal layers below the AC capacitors often become unusable) and can often result in challenges with routing signal traces.

Thus, a need exists for improved apparatus and methods for placement of discrete electrical components on internal layers of a PCB to increase component density of the PCB.

SUMMARY

Apparatus and methods for placement of discrete electrical components on internal layers of a PCB are described herein. In some embodiments, a printed circuit board (PCB) defines a first outer surface and a second outer surface that is opposite the first outer surface. The first outer surface of the PCB defines a recess. The PCB includes a signal layer between the first outer surface and the second surface with a first portion exposed within the recess and a second portion exposed within the recess. A component is disposed within the recess and connected to the first portion and the second portion of the signal layer such that an entirety of the component is within the recess and below the first surface.

DETAILED DESCRIPTION

Figure 1:
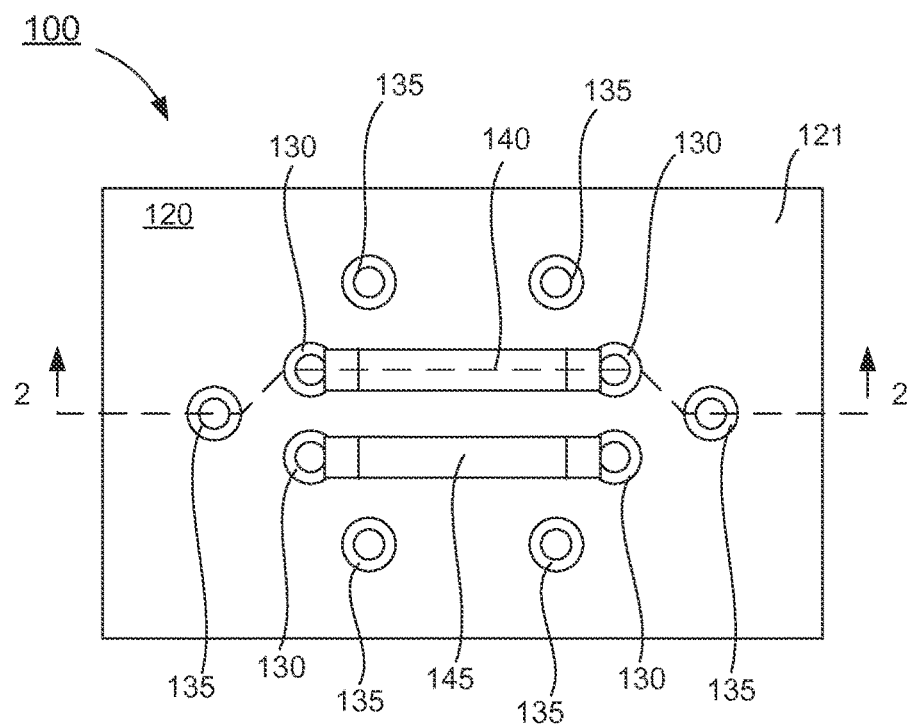
FIG. 1 is a top view schematic illustration of a portion of a known printed circuit board arrangement.

Apparatus and methods for placement of discrete electrical components on internal layers of a PCB are described herein. In some embodiments, a printed circuit board (PCB) defines a first outer surface and a second outer surface that is opposite the first outer surface. The first outer surface of the PCB defines a recess. The PCB includes a signal layer between the first outer surface and the second surface with a first portion exposed within the recess and a second portion exposed within the recess. A component is disposed within the recess and connected to the first portion and the second portion of the signal layer such that an entirety of the component is within the recess and below the first surface.

In some embodiments, a method for forming a PCB includes forming a recess in a first outer surface of the PCB having the first outer surface and a second outer surface. The PCB having a signal layer between the first outer surface and the second outer surface with a first portion exposed within the recess and a second portion exposed within the recess. The method includes connecting a component within the recess to the first portion and the second portion of the signal layer such that an entirety of the component is within the recess and below the first outer surface.

In some embodiments, a PCB defines a first outer surface and a second outer surface that is opposite the first outer surface. The first outer surface of the PCB defines a recess. The PCB includes a signal layer between the first outer surface and the second outer surface. A first component is disposed within the recess and is connected to the signal layer such that an entirety of the first component is within the recess and below the first outer surface. A second component is disposed within the recess and is connected to the signal layer such that an entirety of the second component is within the recess and connected to the signal layer. The first component and the second component collectively define a differential pair.

As used in this specification, the singular forms "a," "an" and "the" include plural referents unless the context clearly dictates otherwise. Thus, for example, the term "a member" is intended to mean a single member or a combination of members, "a material" is intended to mean one or more materials, or a combination thereof.

Note that some terms used herein are referenced with a number, for example, a "first signal layer," "second signal layer," and so on. In some instances, these numbers refer to a particular order, for example, particular signal layers ordered within a PCB. For example, the first signal layer can refer to the topmost signal layer, the second signal layer can refer to the second topmost signal layer, and so on. In other instances, however, these terms can correspond to the order of discussion. For example, the "first signal layer" can refer to the first signal layer discussed and can correspond to any signal layer within the PCB, the "second signal layer" can refer to the second signal layer discussed and can correspond to any signal layer within the PCB, and so. Thus, it should be understood that the specific context will indicate whether the terms "first signal layer," "second signal layer," and so on refers to a specific ordinal layer within the PCB or refers to any particular layer within the PCB.

As used herein, the term "via" refers to an electrical interconnect included in, for example, a printed circuit board. For example, in some embodiments, a first conductive layer can be placed in electrical communication with a second conductive layer by one or more vias. A via can be a through hole defined by the PCB that has a conductive portion such as an annulus or the like. The term "semi-blind via" refers to a via that doesn't extend through the entirety of the PCB. For example, a semi-blind via can be configured to extend through a first set of layers of a PCB but not a second set of layers. Moreover, a semi-blind via is differentiated from a "blind via" or a "buried via" (not discussed herein) that generally refers to a via that extends through a set of inner layers but not the outer layers of a PCB. Thus, a semi-blind via refers to a via that extends through an outer layer (e.g., a single outer layer of a PCB) and a subset of inner layers (e.g., not all the inner layers of the PCB).

As used herein, the term "soldered connection" refers to known methods of applying a fused metal to join two or more metal work pieces. The solder material is configured to melt at a temperature substantially lower than the melting temperature of the work pieces being joined. As described herein, a soldered connection can refer to a connection between, for example, two electrical pads, an electrical pad and an electrical pin, and an electrical pin and a via included in a printed circuit board, and/or any other suitable connection.

As used herein, the term "data processing unit" refers to, for example, any computer, electronic switch, switch fabric, portion of a switch fabric, router, host device, data storage device, line card, backplane or the like used to process, transmit and/or convey electrical and/or optical signals. A data processing unit can include, for example, a component included within an electronic communications network. In some embodiments, for example, a data processing unit can be a component included within or forming a portion of a core switch fabric of a data center. In other embodiments, a data processing unit can be an access switch located at an edge of a data center, or a host or peripheral device (e.g., a server) coupled to the access device. For example, an access switch can be located on top of a chassis containing several host devices.

A printed circuit board used in high-speed signal transfer can include, for example, at least a conducting layer and at least an insulating layer. The conducting layer or layers can include transmission lines such as, for example, microstrips or striplines. The insulating layer or layers can include any suitable dielectric material. For example, in some embodiments, the insulating layer can be any suitable cotton paper and epoxy combination, woven glass and epoxy combination, matte glass and polyester combination, polytetrafluoroethylene (PTFE also known as Teflon®), or the like. In some embodiments, a printed circuit board can include dielectric materials from manufacturers such as, for example, GETEK®, Nelco®, Speedboard, and/or the like.

Figure 2:
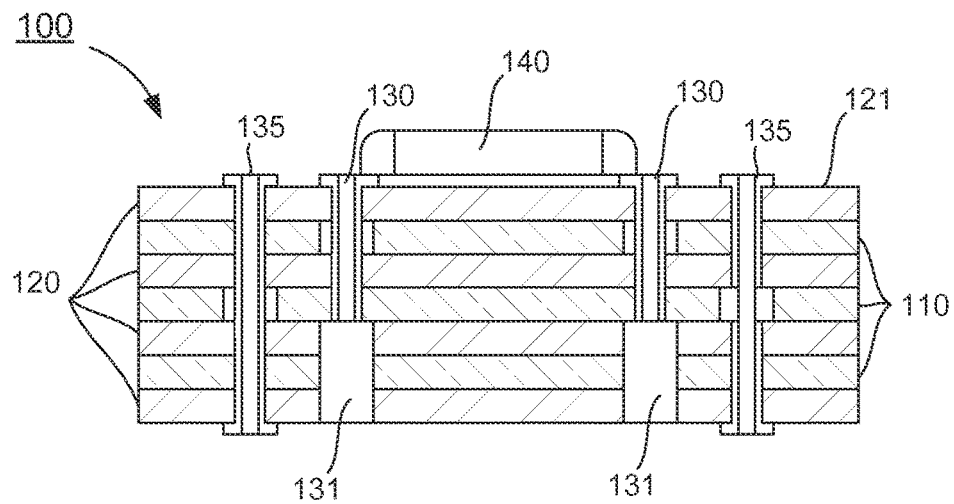
FIG. 2 is a cross-sectional view schematic illustration of the portion of the printed circuit board of FIG. 1, taken along the line 2-2.

FIGS. 1 and 2 illustrate a portion of a known printed circuit board 100 arrangement. The printed circuit board (PCB) 100 can be any suitable PCB configured, at least in part, for use in high-speed signal transfer. For example, in some embodiments, the PCB 100 can be included in a data processing unit, such as those described above. The PCB 100 includes at least a set conducting layers 110, a set of insulating layers 120, a set of signal vias 130, a set of ground vias 135, a first component 140 and a second component 145. The insulating layers 120 can be any suitable electric insulator (e.g., a non-core dielectric layer or a core). As such, the insulating layers 120 can form a base that supports and/or electrically separates multiple conducting layers 110. In some embodiments, the insulating layers 120 can be a dielectric material such as, for example, those described above. In some embodiments, a PCB can include an insulating layer formed from a material (i.e., a pre-preg material) that can be heated to flow into the space between conducting layers and allowed to cool and/or cure to form a substantially rigid (e.g., hardened) non-core insulating layer.

The conducting layers 110 can include, for example, conductive traces etched from a conductive sheet laminated to a core (e.g., an insulating layer). For example, a conductive sheet on one or more outer surfaces of a core can be masked and the undesired portions of the conductive sheet can be etched away, thereby leaving the desired conductive traces. In other embodiments, conductive traces (e.g., of a conducting layer included in a PCB) can be formed via chemical vapor deposition, laser resistant ablation, CNC milling, photoengraving, and/or any other suitable technique. The conducting layers 110 (e.g., also referred to herein as "signal layers") can be formed from any suitable material such as, for example, copper, silver, aluminum, gold, zinc, tin, tungsten, graphite, conductive polymer, and/or any other suitable conductive material. In this manner, the conducting layers 110 can carry a current (e.g., a signal carrying information or the like) along a length of the conducting trace. In some embodiments, a PCB can include conducting layers that are arranged as ground layers, which can be arranged to provide, for example, a return signal path or the like.

The signal vias 130 and the ground vias 135 can be mechanically or laser drilled holes in the PCB 100 that can be filled with an annular conductive ring (e.g., a copper ring or barrel) to facilitate an electrical and/or thermal connection between the conducting layers 110 of the PCB 100. As shown in FIG. 2, the signal vias 130 can include a back drilled portion 131 or the like. In other words, the signal vias 130 can be semi-blind vias that extend through a subset of layers of the PCB 100 but not the entire PCB 100. Conversely, the ground vias 135 can be arranged to extend though the entire PCB 100. As such, the signal vias 130 can be configured to carry an electrical current associated with a signal. The ground vias 135 can be configured to provide a return path for the electrical current, thereby reducing losses and/or signal-to-signal cross-talk, as described in further detail herein. Moreover, the ground vias 135 can extend through layers of the PCB 100 to electrically connect signal layers to ground layers.

In some embodiments, the signal layers 110 can include conducting traces that can be, for example, transmission lines (e.g., microstrips, striplines, or the like). As such, the transmission lines can carry and/or transmit a current with a relatively high frequency, such as, for example, in high-speed signal transmission applications. In such embodiments, it can be desirable to account for the characteristics of the current carried on the transmission lines such that reflections and/or power loss is minimized Therefore, in some embodiments, the transmission lines can define differential pairs (e.g., parallel signal traces) to reduce signal noise and/or electromagnetic interference. In other embodiments, the transmission lines can define single-ended links. In some embodiments, the transmission lines can further have a characteristic impedance configured to substantially match and/or otherwise relate to the impedance of a set of electrical components.

In some embodiments, the transmission lines can be routed between electrical components (not shown in FIGS. 1 and 2) such as, for example, between a transmitter and a receiver. In some instances, it may be desirable to provide alternating current (AC) isolation between the electrical components. For example, in some embodiments, the first component 140 and/or the second component 145 can be AC capacitors or the like that are each electrically coupled to a transmission line to provide, for example, the desired AC isolation. More specifically and as shown in FIGS. 1 and 2, the first component 140 and the second component 145 can each be physically and electrically coupled to a separate pair of the signal vias 130. Thus, the components 140 and 145 can be disposed on or about the signal vias 130 and can include pins (not shown in FIGS. 1 and 2) that can be inserted into the signal vias 130 and soldered into place to define a physical and electrical connection with the conducting layers 110 in contact with the signal vias 130. In some embodiments, the components 140 and 145 can be arranged as, for example, differential pairs.

In some instances, the inclusion of the components 140 and 145 can introduce a characteristic impedance mismatch in the electric circuit. In this manner, the PCB 100 includes multiple ground vias 135 that are configured to improve the characteristic impedance mismatch and/or to reduce signal-to-signal cross-talk or the like. For example, as shown in FIG. 1, the PCB 100 includes six ground vias 135 that substantially surround the components 140 and 145 and the signal vias 130. As shown in FIG. 2, the use of multiple ground vias 135 increases the space usage of the components 140 and 145 as well as substantially limiting the use of portions of the conducting layers 110 below the components 140 and 145 for other purposes such as traces or the placement of different components.

Figure 3:
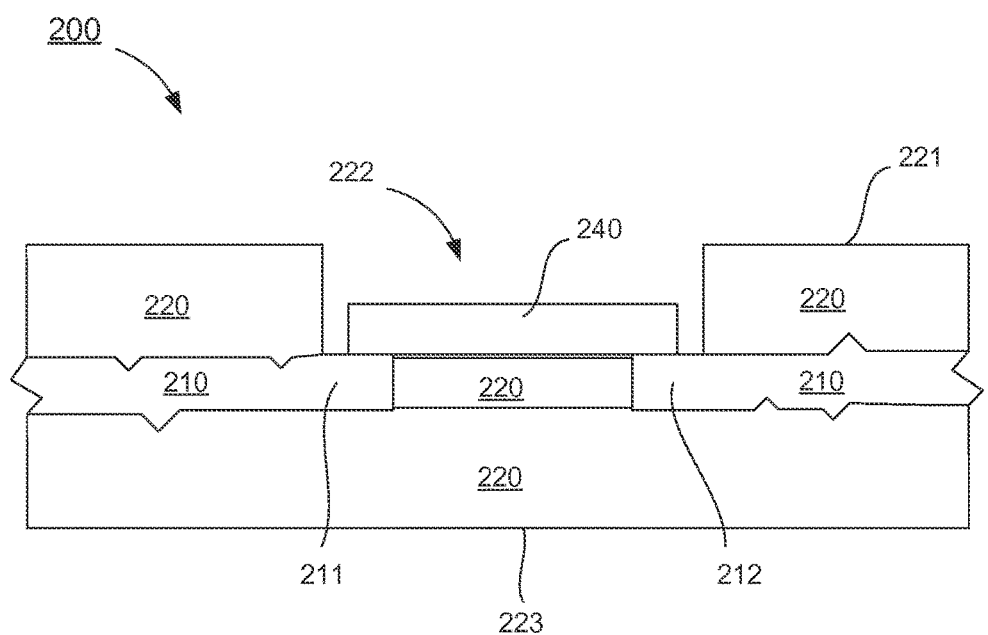
FIG. 3 is a schematic illustration of a portion of a printed circuit board, according to an embodiment.

FIG. 3 is a schematic illustration of a printed circuit board 200, according to an embodiment. The printed circuit board (PCB) 200 can be any suitable PCB configured, at least in part, for use in high-speed signal transfer. For example, in some embodiments, the PCB 200 can be included in a data processing unit, such as those described above. The PCB 200 includes at least a conducting layer 210 disposed between a pair of insulating layers 220 and in electrical communication with a component 240. The insulating layers 220 can be made from any suitable electric insulator (e.g., a dielectric material) that can form a base that supports and/or electrically separates multiple conducting layers (only one conducting layer 210 is shown in FIG. 3). As shown in FIG. 3, the insulating layers 220 can be configured to substantially surround or circumscribe the conducting layer 210. In this manner, the insulating layers 220 can form or define a first surface 221 and a second surface 223, opposite the first surface 221, of the PCB 200.

The first surface 221 of the PCB 200 defines a recess 222 within which the component 240 can be disposed. The recess 222 can be any suitable shape, size, or configuration. For example, in some embodiments, the recess 222 can have a shape that is substantially rounded (e.g., circular, oblong, elliptical, etc.). In other embodiments, the recess 222 can have a shape that is substantially polygonal (e.g., rectangular, square, pentagonal, hexagonal, etc.) with rounded or non-rounded corners. In this manner, the recess 222 can extend through the insulating layer 220 to expose a portion of the conducting layer 210, as described in further detail herein.

The recess 222 can be formed during manufacturing using any suitable technique. For example, in some embodiments, the first surface 221 can be mechanically drilled (e.g., with a drill bit or milling operation) to define the recess 222. In other embodiments, the first surface 221 can be laser drilled using one or more cutting operations (e.g., a relatively rough laser drilling followed by a relatively fine laser drilling) to define the recess 222. In some embodiments, the first surface 221 can be punched or the like to define the recess 222. In still other embodiments, the recess 222 can be formed using any suitable combination of operations. In some instances, the combination of drilling operations can increase the accuracy and repeatability of defining the recess 222 such that a portion of the conducting layer 210 is exposed. For example, in some embodiments, a first surface of a PCB can be mechanically drilled to a predetermined depth and then can be laser drilled (via a fine laser drilling operation) to a second predetermined depth to expose a portion of a conducting layer. Moreover, in some instances, the first surface 221 can be drilled to define the recess 222 prior to lamination of the PCB 200. In other instances, the first surface 221 can be drilled to define the recess 222 after lamination of the PCB 200.

As described above with reference to the conducting layers 110 of FIGS. 1 and 2, the conducting layer 210 (also referred to herein as "signal layer") can include, for example, conductive traces etched from a conductive sheet laminated to a core (e.g., an insulating layer). In this manner, the conducting layers 210 can carry a current (e.g., a signal carrying information or the like) along a length of the conducting trace. In some embodiments, the conducting layer 210 can include one or more conducting traces that can be, for example, transmission lines (e.g., microstrips, striplines, or the like). The transmission lines can carry and/or transmit a current with a relatively high frequency, such as, for example, the frequencies generally seen in high-speed signal transmission applications. In some instances, it can be desirable to account for the characteristics of the current carried on the transmission lines such that reflections and/or power loss is minimized. Therefore, in some embodiments, the transmission lines can be arranged as differential pairs that can reduce signal noise and/or electromagnetic interference. In other embodiments, the transmission lines can define single-ended links. In some embodiments, the transmission lines can have a characteristic impedance that can substantially match and/or otherwise relate to the characteristic impedance of a set of electrical components. In some embodiments, the PCB 200 can include a set of ground layers (e.g., any of the conducting layers 210) that can reduce characteristic impedance mismatches and/or the like. Although the PCB 200 is shown in FIG. 3 as including a single conducting layer 210, in other embodiments, a PCB can include any number of conducting layers that can be, for example, signal layers or ground layers.

As described above, in some embodiments, the transmission lines of the conducting layer 210 can be routed between electrical components (not shown in FIG. 3) such as, for example, between a transmitter and a receiver. In some instances, it may be desirable to provide alternating current (AC) isolation between the electrical components. For example, in some embodiments, the component 240 can be an AC capacitor (i.e., a serial capacitor) or the like that is electrically coupled to the conductive layer 210 to provide, for example, the desired AC isolation. More specifically and as shown in FIG. 3, the conducting layer 210 can include a first portion 211 and a second portion 212 that are exposed within the recess 222 defined by the first surface 221. In this manner, the component 240 can be disposed within the recess 222 to be physically and electrically coupled to the first portion 211 and the second portion 212 of the conducting layer 210. Although the component 240 is shown in FIG. 3 as being entirely disposed within the recess 222, in other embodiments, a component need not be entirely disposed within a recess.

In some embodiments, the component 240 can be configured to complete an electrical circuit. For example, as shown in FIG. 3, the first portion 211 and the second portion 212 of the conducting layer 210 can be separated by a dielectric material (e.g., the insulating layer 220). In other embodiments, the first portion 211 and the second portion 212 can be physically and electrically separated by air (e.g., the dielectric material is air). Thus, the component 240 can be physically and electrically coupled to the first portion 211 and to the second portion 212 of the conducting layer 210, thereby bridging the portions 211 and 212. The component 240 can be disposed within the recess 222 and coupled to the first portion 211 and the second portion 212 of the signal layer using any suitable manufacturing technique. For example, in some instances, the component 240 can be placed using known surface mounting techniques. In other words, the component 240 can be disposed within the recess 222 and electrically coupled to the internal conducting layer 210 without being embedded in the PCB 200 (e.g., physically and electrically connected to a conducting layer of the PCB 200 and substantially encased, circumscribed, and/or otherwise surrounded by insulating layers and/or other conducting layers of the PCB 200). Moreover, the component 240 can be physically and electrically coupled to the first portion 211 and the second portion 212 via a soldered connection and/or conductive paste. For example, in some embodiments, the component 240 can include a pin or pad that can be placed in contact with the exposed first portion 211 and the exposed second portion 212 and a needle or the like can deliver solder to couple the component 240 thereto.

As shown in FIG. 3, by defining the recess 222 in the first surface 221 of the PCB 200, the component 240 can be placed in direct electrical contact with the signal layer 210 (e.g., the first portion 211 and the second portion 212). In other words, the component 240 is physically and electrically coupled directly to the conducting layer 210, thereby obviating the need for signal vias (see e.g., FIGS. 1 and 2). Thus, the disadvantages (e.g., losses and/or via-to-via crosstalk) associated with signal vias are significantly reduced or eliminated. As a result, the need for ground vias (see e.g., FIGS. 1 and 2) to provide a return path for the signal and to reduce cross-talk is also obviated. In this manner, the amount of space used on the PCB 200 by the inclusion of the component 240 is greatly reduced, thereby allowing for easier routing of signal traces (e.g., near and/or below the component 240) as well as allowing for an increased component density on the PCB 200. Similarly stated, the routing on any other internal signal layer (not shown in FIG. 3) is not affected by vias (e.g., signal vias and/or ground vias), thereby improving density and reducing cross-talk. For example, a portion of the PCB 200 associated with the component 240 can have a component density and a crosstalk greater than and less than, respectively, a component density and a cross talk of a PCB having a component connected to a signal layer with ground vias configured to provide electromagnetic interference shielding.

Figure 4:
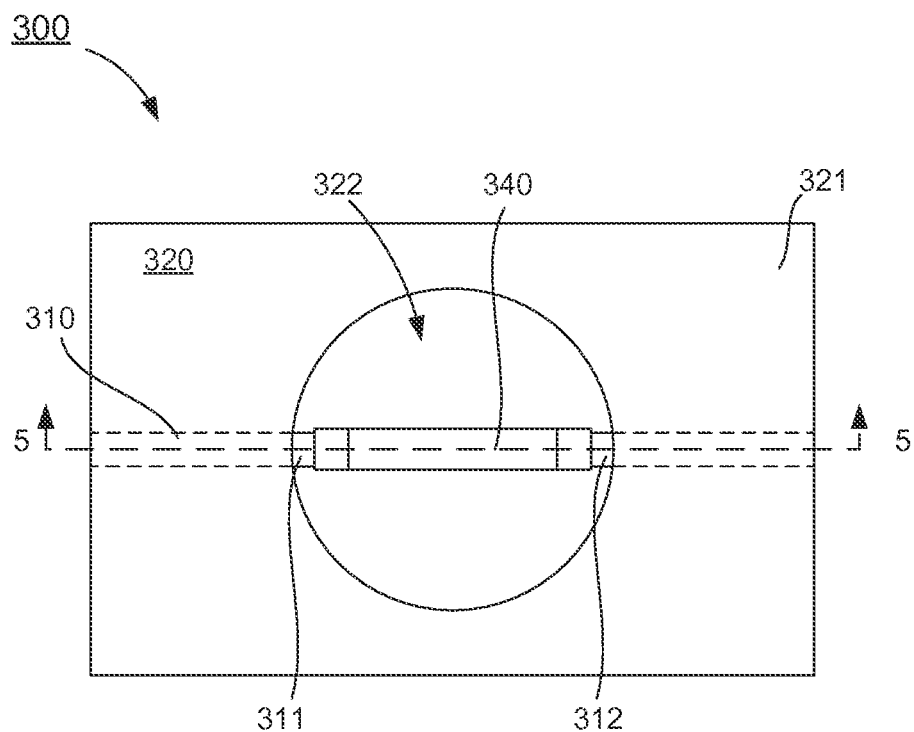
FIG. 4 is a top view schematic illustration of a portion of a printed circuit board, according to another embodiment.
Figure 5:
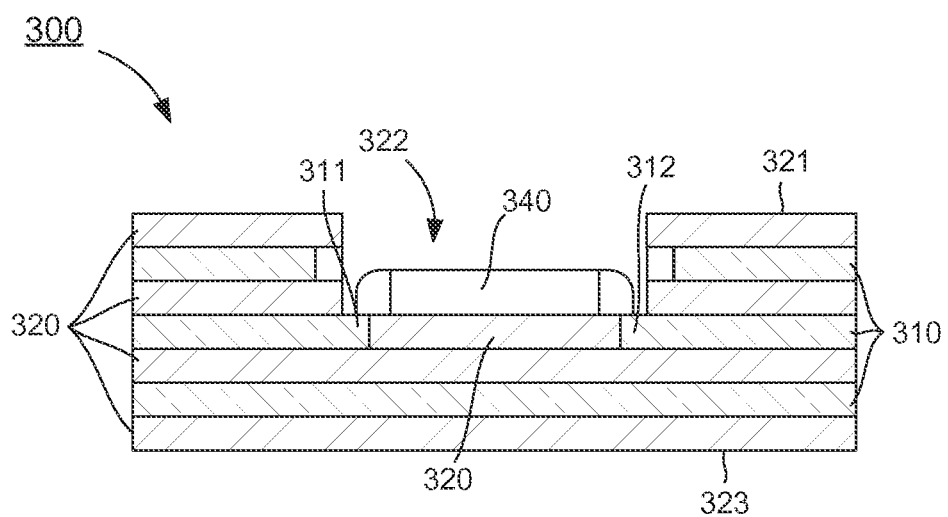
FIG. 5 is a cross-sectional schematic illustration of the portion of the printed circuit board of FIG. 4, taken along the line 5-5.

FIGS. 4 and 5 illustrated a PCB 300, according to another embodiment. The printed circuit board (PCB) 300 can be any suitable PCB configured, at least in part, for use in high-speed signal transfer. For example, in some embodiments, the PCB 300 can be included in a data processing unit, such as those described above. The PCB 300 includes a set of conducting layers 310, a set of insulating layers 320, and a component 340. The insulating layers 320 can be made from any suitable electric insulator (e.g., a dielectric material) that can form a base that supports and/or electrically separates the conducting layers 310. For example, as shown in FIG. 5, the PCB 300 is formed from a stack of alternating insulating layers 320 and conducting layers 310. Moreover, the PCB 300 can be arranged such that an insulating layer 320 is disposed on a top and a bottom of the stack of layers. In this manner, the insulating layers 320 can form or define a first surface 321 and a second surface 323, opposite the first surface 321, of the PCB 300 between which any suitable number of alternating conducting layers 310 and insulating layers 320 can be disposed.

The first surface 321 of the PCB 300 defines a recess 322 within which the component 340 can be disposed. The recess 322 can be any suitable shape, size, or configuration and can be formed during manufacturing via any suitable technique (e.g., such as those described above). For example, as shown in FIG. 4, the recess 322 can be substantially circular. In this manner, the recess 322 can extend through, for example, a first insulating layer 320 (e.g., a top layer), a first conducting layer 310, and a second insulating layer 320 to expose a portion of an inner conducting layer 310 (e.g., a center conducting layer 310 (FIG. 5)), as described in further detail herein. Although the PCB 300 is shown in FIG. 5 as including an insulating layer 320 forming the first surface 321 and the second surface 323, in other embodiments, a PCB can include a conducting layer (e.g., a signal layer or a ground layer) that can form the first surface and/or the second surface of the PCB. In such embodiments, the PCB can form a recess in the first conducting layer (e.g., a top layer) and an insulating layer disposed therebelow to expose, for example, a portion of an internal signal layer.

As described above with reference to the conducting layers 110 of FIGS. 1 and 2, the conducting layer 310 (also referred to herein as "signal layer") can include, for example, conductive traces etched from a conductive sheet laminated to a core (e.g., an insulating layer). In this manner, the conducting layers 310 can carry a current (e.g., a signal carrying information or the like) along a length of the conducting trace. In some embodiments, the conducting layer 310 can include one or more conducting traces that can be, for example, transmission lines (e.g., microstrips, striplines, or the like). The transmission lines can carry and/or transmit a current with a relatively high frequency, such as, for example, the frequencies generally seen in high-speed signal transmission applications, as described in detail above. In some embodiments, the PCB 300 can include a set of ground layers (e.g., any of the conducting layers 310) that can reduce characteristic impedance mismatches and/or the like. Although the PCB 300 is shown in FIG. 5 as including a set of three conducting layers 210, in other embodiments, a PCB can include any number of conducting layers that can be, for example, signal layers or ground layers.

In some instances, it may be desirable to provide AC isolation between the electrical components. As such, the component 340 can be, for example, an AC capacitor (i.e., a serial capacitor) or the like that is electrically coupled to the conductive layer 310 to provide, for example, the desired AC isolation. More specifically and as shown in FIGS. 4 and 5, the conducting layer 310 can include a first portion 311 and a second portion 312 that are exposed within the recess 322 defined by the first surface 321. In this manner, the component 340 can be disposed within the recess 322 to be physically and electrically coupled to the first portion 311 and the second portion 312 of the conducting layer 310, as described in detail above with reference to FIG. 3. In some embodiments, the component 340 can be configured to complete an electrical circuit. For example, as shown in FIG. 5, the first portion 311 and the second portion 312 of the conducting layer 310 can be separated by a dielectric material (e.g., an insulating layer 320 (see e.g., FIG. 5)). Thus, the component 340 can be physically and electrically coupled to the first portion 311 and to the second portion 312 of the conducting layer 310, thereby bridging the portions 311 and 312.

As shown in FIG. 5, by defining the recess 322 in the first surface 321 of the PCB 300, the component 340 can be placed in direct electrical contact with the signal layer 310 (e.g., the first portion 311 and the second portion 312). In other words, the component 340 is physically and electrically coupled directly to the conducting layer 310, thereby obviating the need for signal vias (see e.g., FIGS. 1 and 2). Thus, the disadvantages (e.g., losses and/or via-to-via crosstalk) associated with signal vias are significantly reduced or eliminated. As a result, the need for ground vias (see e.g., FIGS. 1 and 2) to provide a return path for the signal and to reduce cross-talk is also obviated. In this manner, the amount of space used on the PCB 300 by the inclusion of the component 340 is greatly reduced, thereby allowing for easier routing of signal traces (e.g., near and/or below the component 340) as well as allowing for an increased component density on the PCB 300. Similarly stated, the routing on any other conducting layer 310 (e.g., a signal layer or a ground layer) below the signal layer coupled to the component 340 is not affected by vias (e.g., signal vias and/or ground vias), thereby improving density and reducing crosstalk. For example, a portion of the PCB 300 associated with the component 340 can have a component density and a cross-talk greater than and less than, respectively, a component density and a cross talk of a PCB having a component connected to a signal layer with ground vias configured to provide electromagnetic interference shielding.

Although the recess 322 is shown in FIG. 5 as extending through one conducting layer 310 (e.g., a signal layer or a ground layer) and two insulating layers 320, in other embodiments, a PCB can include any number of conducting layers and insulating layers and can be arranged to include and/or define a recess that extends through any number of conducting layers and/or insulating layers. For example, in some embodiments, a PCB can include a top conducting layer and an insulating layer disposed below the conducting layer. As such, the PCB can include a recess that extends through one conducting layer and one insulating layer to expose and internal signal layer to which a component can be coupled. In other embodiments, a PCB can include a recess that extends though more than one conducting layer (e.g., two, three, four, five, six, or more) and more than one insulating layer (e.g., two, three, four, five, six, or more).

Figure 6:
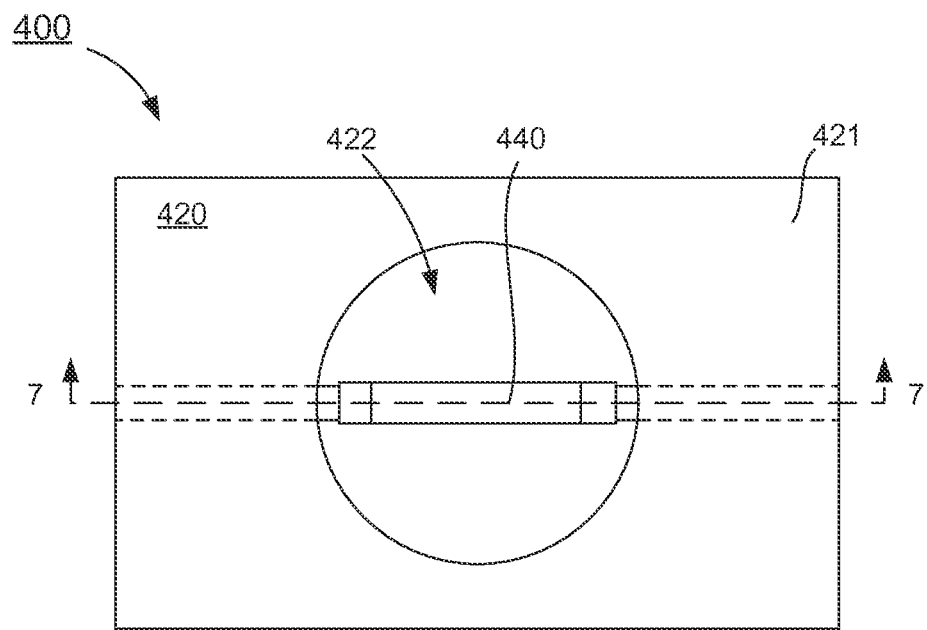
FIG. 6 is a top view schematic illustration of a portion of a printed circuit board, according to another embodiment.
Figure 7:
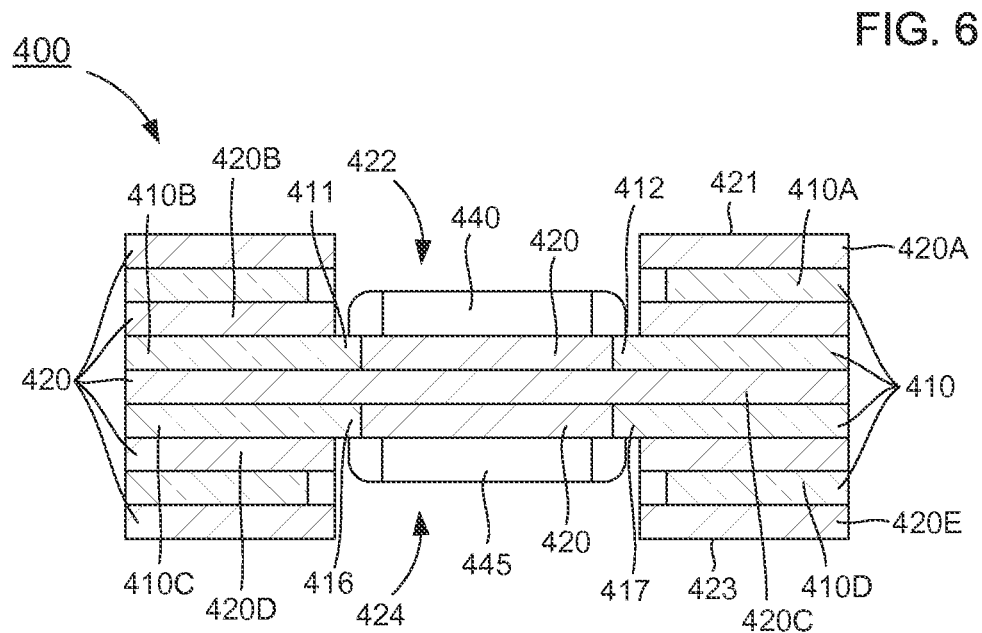
FIG. 7 is a cross-sectional schematic illustration of the portion of the printed circuit board of FIG. 6, taken along the line 7-7.

Although the first surface 321 of the PCB 300 is shown in FIGS. 4 and 5 as defining the recess 322, in other embodiments, a PCB can include a first surface that can define a recess and/or a second surface that can define a recess. For example, FIGS. 6 and 7 illustrate a PCB 400, according to another embodiment. The PCB 400 can be included in a data processing unit, such as those described above. The PCB 400 includes a set of conducting layers 410, a set of insulating layers 420, a first component 440, and a second component 445. The PCB 400 can arranged in a similar manner as the PCBs 200 and 300 described above. Therefore, portions of the PCB 400 are not described in further detail herein. For example, the insulating layers 420 and the conducting layers 410 can be substantially similar to the insulating layers 220 and 320 and the conductive layers 210 and 310, respectively, except in the aspects explicitly described herein. As such, the PCB 400 can be arranged such that the insulating layers 420 form or define a first surface 421 (e.g., a top surface) and a second surface 423 (e.g., a bottom surface), opposite the first surface 421, of the PCB 400 between which any suitable number of alternating conducting layers 410 and insulating layers 420 can be disposed.

The first surface 421 of the PCB 400 defines a recess 422 within which the first component 440 can be disposed. The recess 422 can be any suitable shape, size, or configuration and can be formed during manufacturing via any suitable technique (e.g., such as those described above with reference to the PCB 200 of FIG. 3). For example, as shown in FIG. 6, the recess 422 can be substantially circular. In this manner, the recess 422 can extend through, for example, a first insulating layer 420A (e.g., a top layer), a first conducting layer 410A, and a second insulating layer 420B to expose a portion of a second conducting layer 410B (e.g., an inner signal layer), as described in further detail herein. Similarly, the second surface 423 of the PCB 400 defines a recess 424 within which the second component 445 can be disposed. For example, the recess 424 can extend through, for example a fifth insulating layer 420E, a fourth conducting layer 410D, and a fourth insulating layer 420D to expose a portion of a third conducting layer 410C (e.g., a second inner signal layer).

Although not shown in FIGS. 6 and 7, the recess 424 defined by the second surface 423 can be substantially similar in shape and size as the recess 422 defined by the first surface 421. In other embodiments, the shape and/or size of the recess 424 defined by the second surface 423 can be different from the shape and/or size, respectively, of the recess 422 defined by the first surface 421.

As described above with reference to the conducting layers 110 of FIGS. 1 and 2, the conducting layers 410 (also referred to herein as "signal layer") can include, for example, conductive traces etched from a conductive sheet laminated to a core (e.g., an insulating layer). In this manner, the conducting layers 410 can carry a current (e.g., a signal carrying information or the like) along a length of the conducting trace. In some embodiments, the conducting layer 410 can include one or more conducting traces that can be, for example, transmission lines, as described above. In some embodiments, the PCB 400 can include a set of ground layers (e.g., any of the conducting layers 410) that can reduce characteristic impedance mismatches.

In some instances, it may be desirable to provide AC isolation between the electrical components. As such, the first component 440 and the second component 445 can be, for example, AC capacitors (i.e., serial capacitors) or the like that are electrically coupled to the second conductive layer 410B and the third conducting layer 410C to provide, for example, the desired AC isolation. More specifically and as shown in FIGS. 6 and 7, the second conducting layer 410B (e.g., a first inner signal layer) can include a first portion 411 and a second portion 412 that are exposed within the recess 422 defined by the first surface 421 and the third conducting layer 410C (e.g., a second inner signal layer) can include a first portion 416 and a second portion 417 that are exposed within the recess 424 defined by the second surface 423. In this manner, the first component 440 can be disposed within the recess 422 defined by the first surface 421 to be physically and electrically coupled to the first portion 411 and the second portion 412 of the corresponding second conducting layer 410B, and the second component 445 can be disposed within the recess 424 defined by the second surface 423 to be physically and electrically coupled to the first portion 416 and the second portion 417 of the corresponding third conductive layer 410C.

In some embodiments, the first component 440 can be configured to complete a first electrical circuit (e.g., a first circuit line), and the second component 445 can be configured to complete a second electrical circuit (e.g., a second circuit line). For example, as shown in FIG. 7, the first portions 411 and 416 can be separated from the second portions 412 and 417, respectively, by a dielectric material (e.g., an insulating layer 420 (see e.g., FIG. 7)). Thus, the first component 440 and the second component 445 can be configured to bridge the first portions 411 and 416, respectively, and the second portions 412 and 417, respectively.

As shown in FIG. 7, by defining the recess 422 in the first surface 421 of the PCB 400, the component 440 can be placed in direct electrical contact with the signal layer 410 (e.g., the first portion 411 and the second portion 412). In other words, the component 440 is physically and electrically coupled directly to the conducting layer 410, thereby obviating the need for signal vias (see e.g., FIGS. 1 and 2). Thus, the disadvantages (e.g., losses and/or via-to-via crosstalk) associated with signal vias are significantly reduced or eliminated. As a result, the need for ground vias (see e.g., FIGS. 1 and 2) to provide a return path for the signal and to reduce cross-talk is also obviated. In this manner, the amount of space used on the PCB 400 by the inclusion of the component 440 is greatly reduced, thereby allowing for easier routing of signal traces as well as allowing for an increased component density on the PCB 400. Similarly stated, the routing on any other conducting layer 410 (e.g., a signal layer or a ground layer) below the signal layer coupled to the component 440 is not affected by vias (e.g., signal vias and/or ground vias), thereby improving density and reducing cross-talk. Moreover, by obviating the need for signal vias and ground vias, the recess 424 defined by the second surface 423 can be substantially aligned with the recess 422 defined by the first surface 421. Thus, the second component 445 can be substantially aligned with the first component 440. In this manner, a portion of the PCB 400 associated with the first component 440 and the second component 445 can have a component density and a crosstalk greater than and less than, respectively, a component density and a cross talk of a PCB having a first component connected to a first signal layer and a second component connected to a second signal layer with ground vias configured to provide electromagnetic interference shielding. Although the first recess 422 and the second recess 424 are shown as being aligned, in other embodiments, the recess 422 can be defined at any position along the first surface 421 and the recess 424 can be defined at any position along the second surface 423. In other words, the recess 422 and 424 and the components 440 and 445 need not be aligned.

Figure 8:
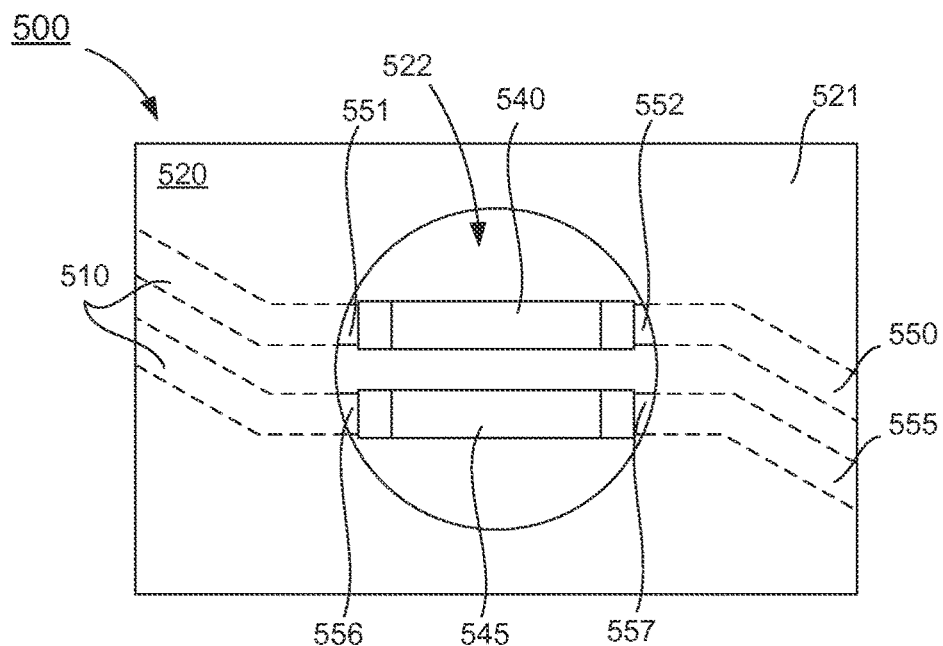
FIG. 8 is a top view schematic illustration of a portion of a printed circuit board, according to another embodiment.

Although FIG. 6 illustrates a single component 440 disposed in the recess 422 defined by the first surface 421, in other embodiments, any number of components can be disposed in a recess defined by a surface of a PCB. For example, FIG. 8 illustrates a PCB 500, according to another embodiment. The PCB 500 can be included in a data processing unit, such as those described above. The PCB 500 includes at least one conducting layer 510, at least one insulating layer 520, a first component 540, and a second component 545. The PCB 500 can arranged in a similar manner as the PCBs 200 and 300 described above. Therefore, portions of the PCB 500 are not described in further detail herein. For example, the insulating layer 520 and the conducting layer 510 can be substantially similar to the insulating layers 220 and 320 and the conductive layers 210 and 310, respectively, except in the aspects explicitly described herein. As such, the PCB 500 can be arranged such that the insulating layer 520 forms or defines a first surface 521 and a second surface (not shown in FIG. 8), opposite the first surface 521, of the PCB 500 between which any suitable number of alternating conducting layers (not shown in FIG. 8) and insulating layers (not shown in FIG. 8) can be disposed.

The first surface 521 of the PCB 500 defines a recess 522 within which the first component 540 and the second component 545 can be disposed. The recess 522 can be any suitable shape, size, or configuration and can be formed during manufacturing via any suitable technique (e.g., such as those described above with reference to the PCB 200 of FIG. 3). For example, as shown in FIG. 8, the recess 522 can be substantially circular. In this manner, the recess 522 can extend through, for example, a first insulating layer 520 (e.g., a top layer) to expose a portion of an inner conducting layer 510, as described in further detail herein. As described above with reference to the conducting layers 110 of FIGS. 1 and 2, the conducting layer 510 (also referred to herein as "signal layer") can include, for example, conductive traces (e.g., transmission lines or the like) etched from a conductive sheet laminated to a core (e.g., an insulating layer). More specifically, the signal layer 510 can include a first circuit line 550 (e.g., a first electric circuit line) and a second circuit 555 (e.g., a second electric circuit line). In this manner, the circuit lines 550 and 555 can carry a current (e.g., a signal carrying information or the like) along a length of the conducting trace. More specifically, the first circuit line 550 and the second circuit line 555 can be arranged as differential pairs.

In some instances, it may be desirable to provide AC isolation between, for example, a transmitter and a receiver that are electrically coupled to the first circuit line 550 and/or the second circuit line 555. As such, the first component 540 and the second component 545 can be, for example, AC capacitors (i.e., serial capacitors) or the like that are electrically coupled to the first circuit line 550 and the second circuit lie 555, respectively, to provide, for example, the desired AC isolation. More specifically and as shown in FIG.

8, the first circuit line can include a first portion 551 and a second portion 552, and the second circuit line 555 can include a first portion 556 and a second portion 557, that all are exposed within the recess 522 defined by the first surface 521 of the PCB 500. In this manner, the components 540 and 545 can be disposed within the recess 522 defined by the first surface 521 to be physically and electrically coupled to the first portion 551 and the second portion 552 of the first circuit line 550 and the first portion 556 and the second portion 557 of the second circuit line 555, respectively. In this manner, the first component 540 and the second component 545 can be arranged as differential pairs that can, for example, reduce a characteristic impedance mismatch or the like.

As shown in FIG. 8, by defining the recess 522 in the first surface 521 of the PCB 500, the first component 540 and the second component 545 can be placed in direct electrical contact with the first circuit line 550 and the second circuit line 555, respectively. In other words, the components 540 and 545 are physically and electrically coupled directly to the first circuit line 550 and the second circuit line 555, respectively, thereby obviating the need for signal vias (see e.g., FIGS. 1 and 2). Thus, the disadvantages (e.g., losses and/or via-to-via cross-talk) associated with signal vias are significantly reduced or eliminated. As a result, the need for ground vias (see e.g., FIGS. 1 and 2) to provide a return path for the signal and to reduce cross-talk is also obviated. In this manner, the amount of space used on the PCB 500 by the inclusion of the components 540 and 545 is greatly reduced, thereby allowing for easier routing of signal traces as well as allowing for an increased component density on the PCB 500. Similarly stated, the routing on any other conducting layer 510 (e.g., a signal layer or a ground layer) below the signal layer coupled to the components 540 and 545 is not affected by vias (e.g., signal vias and/or ground vias), thereby improving density and reducing cross-talk. For example, a portion of the PCB 500 associated with the components 540 and 545 can have a component density and a cross-talk greater than and less than, respectively, a component density and a cross talk of a PCB having a component connected to a signal layer with ground vias configured to provide electromagnetic interference shielding.

Figure 9:
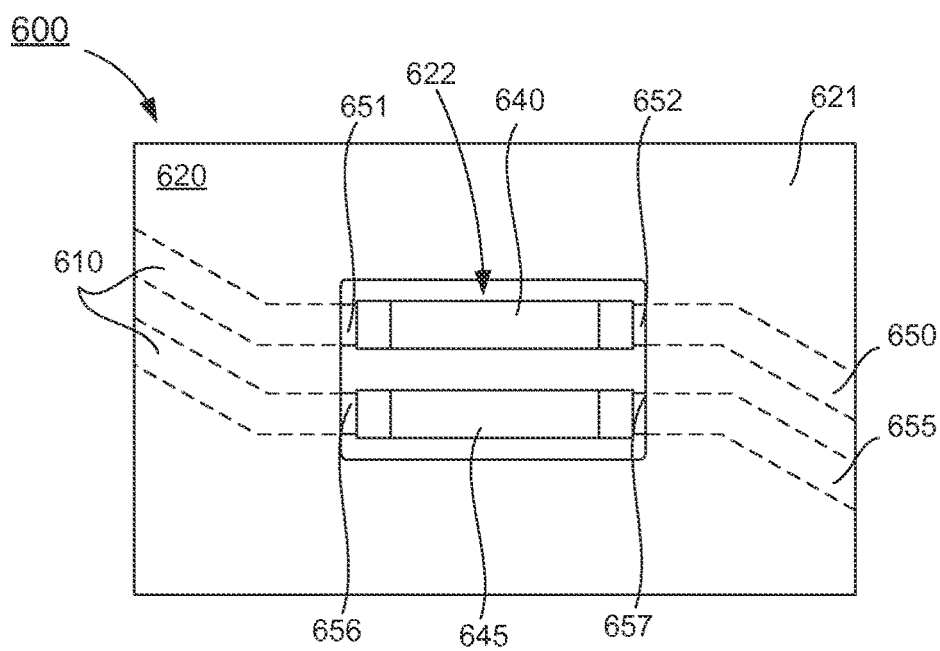
FIG. 9 is a top view schematic illustration of a portion of a printed circuit board, according to another embodiment.

Although the recesses 322, 422, and 522 of the PCBs 300, 400, and 500, respectively, are each described as being substantially circular, in other embodiment, a PCB can include a recess that is any suitable shape, size, or configuration. For example, FIG. 9 illustrates a PCB 600, according to another embodiment. The PCB 600 can be included in a data processing unit, such as those described above. The PCB 600 includes at least one conducting layer 610, at least one insulating layer 620, a first component 640, and a second component 645. The PCB 600 can arranged in a similar manner as the PCBs 200, 300, 400, and/or 500 described above. Therefore, portions of the PCB 600 are not described in further detail herein. For example, the insulating layer 620 and the conducting layer 610 can be substantially similar to the insulating layers 220 and 320 and the conductive layers 210 and 310, respectively, except in the aspects explicitly described herein. As such, the PCB 600 can be arranged such that the insulating layer 620 forms or defines a first surface 621 and a second surface (not shown in FIG. 9), opposite the first surface 621, of the PCB 600 between which any suitable number of alternating conducting layers (not shown in FIG. 9) and insulating layers (not shown in FIG. 9) can be disposed.

The first surface 621 of the PCB 600 defines a recess 622 within which the first component 640 and the second component 645 can be disposed. The recess 622 can be any suitable shape, size, or configuration. For example, as shown in FIG. 9, the recess 622 can be substantially rectangular. In some embodiments, the recess 622 can be formed during manufacturing via a milling operation(s), a punching operation(s), and/or a laser cutting operation(s). For example, in some embodiments, the first surface 621 can be punched and then laser cut to expose a portion of the conductive layer 610. In some embodiments, the conducting layer 610 can include a mask, an indicator, and/or any other surface feature that can provide an indication of the conducting layer 610 being exposed. For example, in some embodiments, the conducting layer 610 can have a color that is substantially different that a color of the insulating layer 620. In such embodiments, an optical sensor or the like can be used in conjunction with a cutting operation to determine that the conducting layer 610 has be reached.

In this manner, the recess 622 can extend through, for example, a first insulating layer 620 (e.g., a top layer) to expose a portion of an inner conducting layer 610. As described above with reference to the conducting layers 110 of FIGS. 1 and 2, the conducting layer 610 (also referred to herein as "signal layer") can include, for example, conductive traces (e.g., transmission lines or the like) etched from a conductive sheet laminated to a core (e.g., an insulating layer). For example, the conducting layer 610 can include a first circuit line 650 and a second circuit line 655. Therefore, as shown in FIG. 9, the first circuit line 650 can include a first portion 651 and a second portion 652, and the second circuit line 655 can include a first portion 656 and a second portion 657, that all are exposed within the recess 622 defined by the first surface 621 of the PCB 600. In this manner, the components 640 and 645 can be disposed within the recess 622 defined by the first surface 621 to be physically and electrically coupled to the first portion 651 and the second portion 652 of the first circuit line 650 and the first portion 656 and the second portion 657 of the second circuit line 655, respectively. In this manner, the first component 640 and the second component 645 can be arranged as differential pairs that can, for example, reduce a characteristic impedance mismatch or the like.

As shown in FIG. 9, by defining the recess 622 in the first surface 621 of the PCB 600, the first component 640 and the second component 645 can be placed in direct electrical contact with the first circuit line 650 and the second circuit line 655, respectively. In other words, the components 640 and 645 are physically and electrically coupled directly to the first circuit line 650 and the second circuit line 655, respectively, thereby obviating the need for signal vias (see e.g., FIGS. 1 and 2). Thus, the disadvantages (e.g., losses and/or via-to-via cross-talk) associated with signal vias are significantly reduced or eliminated. As a result, the need for ground vias (see e.g., FIGS. 1 and 2) to provide a return path for the signal and to reduce cross-talk is also obviated. In this manner, the amount of space used on the PCB 600 by the inclusion of the components 640 and 645 is greatly reduced, thereby allowing for easier routing of signal traces as well as allowing for an increased component density on the PCB 600. Similarly stated, the routing on any other conducting layer 610 (e.g., a signal layer or a ground layer) below the signal layer coupled to the components 640 and 645 is not affected by vias (e.g., signal vias and/or ground vias), thereby improving density and reducing cross-talk. For example, a portion of the PCB 600 associated with the components 640 and 645 can have a component density and a cross-talk greater than and less than, respectively, a component density and a cross talk of a PCB having a component connected to a signal layer with ground vias configured to provide electromagnetic interference shielding.

Figure 10:
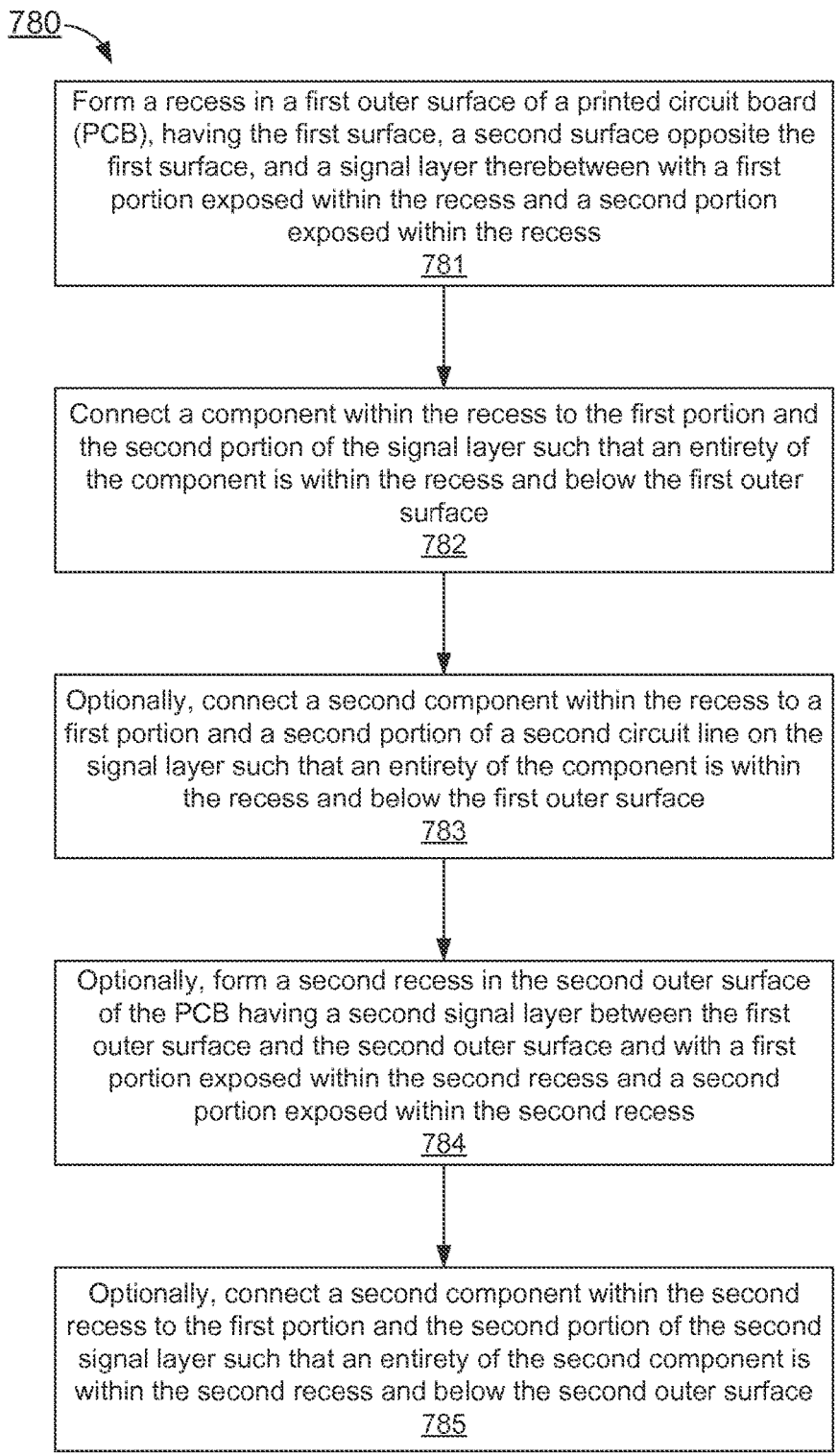
FIG. 10 is a flowchart illustrating a method for forming a printed circuit board, according to an embodiment.

Referring now to FIG. 10, a flowchart is shown illustrating a method 780 of forming a printed circuit board (PCB), according to an embodiment. In some embodiments, the method 780 includes forming a recess in a first outer surface of the PCB, having the first surface, a second surface that is opposite the first surface, and a signal layer therebetween with a first portion exposed within the recess and a second portion exposed within the recess, 781. For example, in some embodiments, the PCB can be substantially similar to the PCB 200, 300, 400, 500, and/or 600 described herein. As such, the PCB can include any number of insulating layers and conducting layers (e.g., signal layers) that can be arranged in an alternating stacked configuration such that an insulating layer is disposed on a top and a bottom of the stacked layers (e.g., the outermost layers of the PCB are insulating layers). Therefore, the insulation layer can be drilled, milled, or otherwise cut (as described above) to define the recess such that the first portion and the second portion of the signal layer are exposed within the recess. In some embodiments, the recess can be formed during a manufacturing and prior to lamination of the PCB. In other embodiments, the PCB can be laminated and then the first surface of the PCB can be drilled, milled, etc. to define the recess.

With the recess formed in the first surface and with the first portion and the second portion of the signal layer being exposed within the recess, a component is connected, within the recess, to the first portion and the second portion of the signal layer such that an entirety of the component is within the recess and below the first outer surface, at 782. For example, the component can placed using any suitable surface mounting technique such that a connection portion (e.g., a pin or pad) component is placed in contact with the first portion and the second portion of the signal layer. In this manner, the component can be physically and electrically coupled to the first portion and the second portion via a soldered connection and/or via conductive paste. The arrangement of the recess, the component, and the first and second portion of the signal layer is such that the component can be electrically coupled to the signal layer without the use of, for example, signal vias or the like and without being embedded in the PCB. Moreover, by electrically coupling the component to the inner signal layer without the use of signal layers, the need for ground vias to reduce electromagnetic interference is obviated. In some embodiments, the component can be, for example, an alternating current (AC) capacitor (i.e., a serial capacitor) or the like.

In some embodiments, the component and the first and second portion of the signal layer can form a first circuit line and the method 780 can include optionally connecting a second component within the recess to a first portion and a second portion of a second circuit line on the signal layer such that an entirety of the second component is within the recess and below the first outer surface, at 783. In some embodiments, the first circuit line and the second circuit line can be arranged as, for example, differential pairs. As such, the recess defined by the first outer surface can be sufficiently large as to accommodate the first component of the first circuit and the second component of the second circuit.

In some embodiments, the method 780 can include optionally forming a second recess in the second outer surface of the PCB having a second signal layer disposed between the first outer surface and the second outer surface and with a first portion exposed within the second recess and a second portion exposed within the second recess, at 784.

In such embodiments, by obviating the need for signal and ground vias, the second recess can be substantially aligned with the first recess. In other embodiment, the second recess can be defined at any suitable position along the second outer surface. With the second recess formed in the second outer surface, a second component 785 is connected, within the recess, to the first portion and the second portion of the second signal layer such that an entirety of the second component is within the second recess and below the second outer surface.

While various embodiments have been described above, it should be understood that they have been presented by way of example only, and not limitation. While the embodiments have been particularly shown and described, it will be understood that various changes in form and details may be made. For example, while the PCBs 200, 300, 400, 500, and 600 illustrate a component being physically and electrically coupled to portions of a circuit line on a single signal layer, in other embodiments, a PCB can include a recess that exposes a portion of a first signal layer and a portion of a second signal layer, different from the first signal layer. In this manner, the component can be coupled in any suitable manner to the portion of the first signal layer and the portion of the second signal layer to electrically couple the signal layers.

While the PCBs 200, 300, 400, 500, and 600 define a recess within which one or two components are disposed, in other embodiments, any suitable number of components can be entirely disposed within a recess. In this manner, the size and/or shape of the recess can be at least partially dependent on the number of components configured to be disposed therein.

Figure 11:
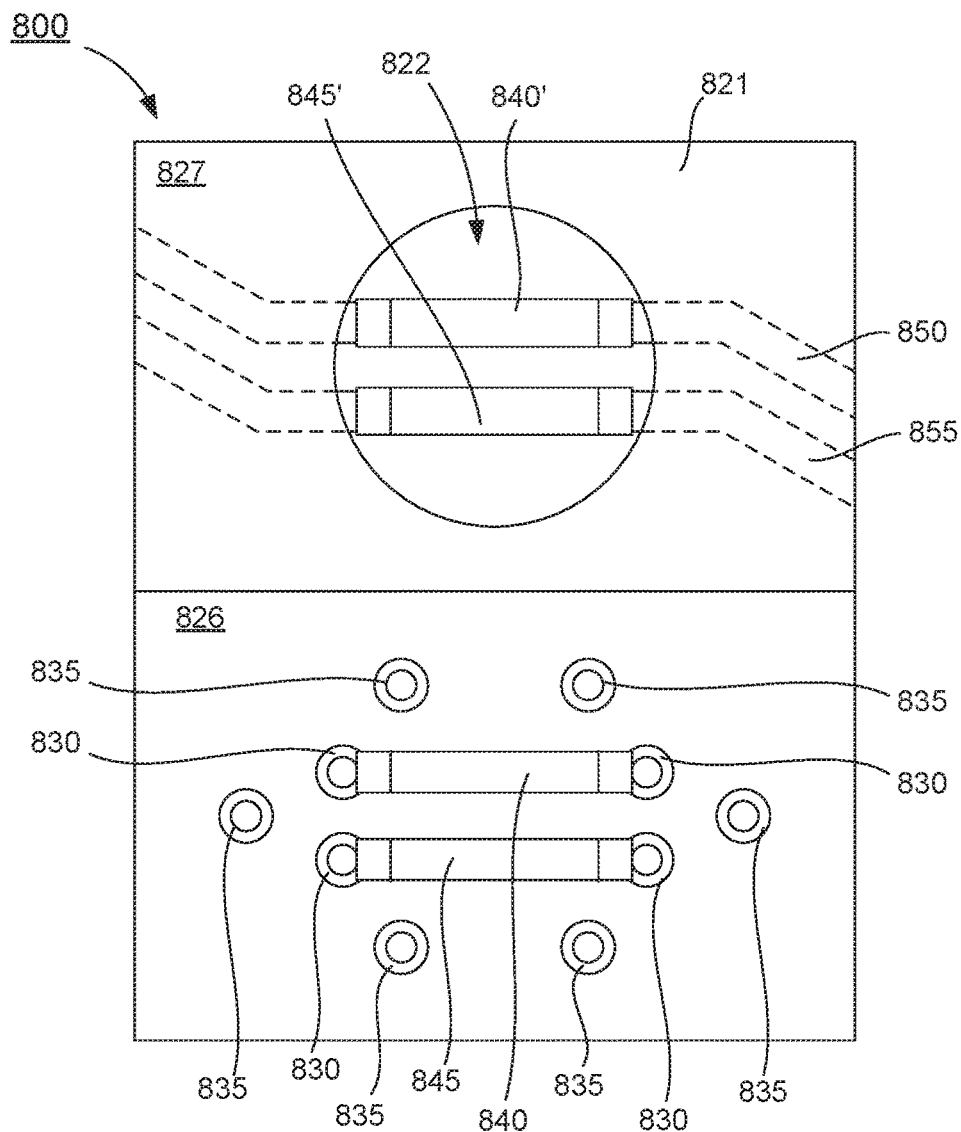
FIG. 11 is a top view schematic illustration of a portion of a printed circuit board, according to an embodiment.

Although various embodiments have been described as having particular features and/or combinations of components, other embodiments are possible having a combination of any features and/or components from any of embodiments as discussed above. For example, FIG. 11 illustrates a portion of a printed circuit board 800 according to an embodiment. The printed circuit board (PCB) 800 includes a first portion 826 and a second portion 827. The first portion 826 of the PCB 800 can be similar to, for example, at least a portion of the PCB 100 described above with reference to FIGS. 1 and 2. For example, as shown in FIG. 11, the first portion 826 includes a first component 840 and a second component 845, which are each physically and electrically coupled to signal vias 830 on a first surface 821 of the PCB 800. Although not shown, the signal vias 830, in turn, are electrically connected to one or more circuit lines (e.g., transmission lines or the like, as described herein). The first portion 826 of the PCB 800 includes multiple ground vias 835 configured to provide electromagnetic interference shielding (e.g., interference associated with characteristic impedance mismatches, signal-to-signal cross-talk, and/or the like) resulting from coupling the components 840 and 845 to the signal vias 830, as described in detail above with reference to the PCB 100.

The second portion 827 of the PCB 800 can be similar to and/or substantially the same as, for example, the PCB 500 (or any of the PCBs described herein). In other words, the PCB 800 can be a combination of the PCB 100 (or portion thereof) and the PCB 500 (or portion thereof). The second portion 827 defines a recess 822 in the first surface 821 of the PCB 800 configured to receive at least a portion of a third component 840' and a portion of a fourth component 845'. As described above with reference to the PCB 500, the third component 840' and the fourth component 845' are physically and electrically coupled to portions of a first circuit line 850 exposed by the recess 822 and portions of a second circuit line 855 exposed by the recess 822, respectively (e.g., transmission lines or the like). As shown in FIG. 11, with the components 840' and 845' being electrically coupled directly to the circuit lines 850 and 855, respectively, the second portion 827 of the PCB 800 can be devoid of signal vias and ground vias. As such, the second portion 827 of the PCB 800 can have a component density and a cross-talk greater than and less than, respectively, a component density and a cross talk of the first portion 826 of the PCB 800, as described in detail above.

Where methods and/or schematics described above indicate certain events and/or patterns occurring in certain order, the ordering of certain events and/or patterns may be modified. For example, while the method 700 describes optionally forming a second recess in the second surface of the PCB (e.g., step 784) after one or more components are disposed in the first recess and connected to the signal layer (e.g., steps 782 and 783), in other embodiments, a second recess can be formed in the second surface (e.g., step 784) after the recess is forming in the first surface (e.g., step 781) and before one or more components are disposed in the recess and connected to the signal layer (e.g., steps 782 and 783).

What is claimed is:

1. An apparatus, comprising:
   a printed circuit board (PCB) having a recess in an outer surface of the PCB, the PCB including a first circuit line having a first portion exposed within the recess and a second portion exposed within the recess, the first circuit line being devoid of electrical contact with vias, the PCB including a second circuit line having a first portion exposed within the recess and a second portion exposed within the recess, the second circuit line being devoid of electrical contact with vias;
   a first component disposed within the recess and connected to the first portion of the first circuit line and the second portion of the first circuit line; and
   a second component disposed within the recess and connected to the first portion of the second circuit line and the second portion of the second circuit line, the first component and the second component collectively defining a differential pair, a characteristic impedance mismatch associated with at least one of the first circuit line or the second circuit line being mitigated based on the first circuit line and the second circuit line being devoid of electrical contact with the vias,
   a first portion of the PCB defining the recess being sized to receive the first component and a size of the second component, a second portion of the PCB mutually exclusive from the first portion of the PCB and having a plurality of ground vias that provide electromagnetic interference shielding for a circuit line in electrical contact with at least one ground via from the plurality of ground vias, a component density of the first portion of the PCB being greater than a component density of the second portion of the PCB.

2. The apparatus of claim 1, wherein the first component is connected to the first circuit line without a signal via or a ground via, and the second component is connected to the second circuit line without a signal via or a ground via.

3. The apparatus of claim 1, wherein the first component and the second component are connected to the first circuit line and the second circuit line, respectively, without a ground via otherwise used to provide electromagnetic interference shielding, the component density of the portion of the PCB associated with the first component and the second component being greater than a component density of a portion of a PCB including a component connected to a circuit line having ground vias used to provide electromagnetic interference shielding,
   a cross-talk associated with the portion of the PCB associated with the first component and the second component being less than a cross-talk of the PCB including the component connected to the circuit line having the ground vias used to provide electromagnetic interference shielding.

4. The apparatus of claim 1, wherein the first component is connected to the first circuit line such that the first component is exposed on the PCB and not embedded within the PCB,
   the second component is connected to the second circuit line such that the second component is exposed on the PCB and not embedded within the PCB.

5. The apparatus of claim 1, wherein the PCB includes a plurality of signal layers and a plurality of ground layers, the first circuit line and the second line being disposed on a signal layer from the plurality of signal layers.

6. The apparatus of claim 1, wherein the PCB includes a plurality of signal layers and a plurality of ground layers, the first circuit line and the second line being disposed on a first signal layer from the plurality of signal layers,
   the recess is a first recess, the outer surface is a first outer surface,
   the PCB has a second recess, the second recess is in a second outer surface of the PCB opposite the first surface of the PCB, the PCB has a second signal layer from the plurality of signal layers different from the first signal layer from the plurality of signal layers, the second signal layer from the plurality of signal layers including a third circuit line having a first portion exposed within the second recess and a second portion exposed within the second recess, the third circuit line being devoid of electrical contact with vias, the second signal layer from the plurality of signal layers including a fourth circuit line having a first portion exposed within the second recess and a second portion exposed within the second recess, the fourth circuit line being devoid of electrical contact with vias,
   the apparatus further comprising:
   a third component disposed within the second recess and connected to the first portion of the third circuit line and the second portion of the third circuit line; and
   a fourth component disposed within the second recess and connected to the first portion of the fourth circuit line and the second portion of the fourth circuit line, the third component and the fourth component collectively defining a differential pair, a characteristic impedance mismatch associated with at least one of the third circuit line or the fourth circuit line being mitigated based on the third circuit line and the fourth circuit line being devoid of electrical contact with the vias,
   a third portion of the PCB defining the second recess being sized to receive the third component and the second component, a component density of the third portion of the PCB being greater than the component density of the second portion of the PCB.

7. The apparatus of claim 1, wherein the PCB is formed from a low loss material associated with high-speed data transfer, the low loss material being a material other than FR-4, the high-speed data transfer being at least 10 Gigabits per second (Gb/s).

8. A method, comprising:
forming a recess in an outer surface of a printed circuit board (PCB), the PCB including a first circuit line having a first portion exposed within the recess and a second portion exposed within the recess, the PCB including a second circuit line having a first portion exposed within the recess and a second portion exposed within the recess;
connecting a first component within the recess directly to the first portion of the first circuit line and the second portion of the first circuit line, without a signal via; and
connecting a second component within the recess directly to the first portion of the second circuit line and the second portion of the second circuit line, without a signal via,
the first component and the second component collectively defining a differential pair, a characteristic impedance mismatch associated with at least one of the first circuit line or the second circuit line being mitigated based on the first component and the second component being directly connected to first circuit line and the second circuit line, respectively,
at least a portion of the PCB connected to the first component and the second component being devoid of ground vias otherwise used to provide electromagnetic interference shielding for the differential pair.

9. The method of claim 8, wherein the PCB is formed from at least one low loss material associated with high-speed data transfer, the at least one low loss material being at least one material other than FR-4, the high-speed data transfer being at least 10 Gigabits per second (Gb/s).

10. The method of claim 8, wherein at least the portion of the PCB connected to the first component and the second component having a component density and a cross talk greater than and less than, respectively, a component density and a cross talk of a PCB including a component connected to a circuit line and ground vias used to provide electromagnetic interference shielding for the circuit line.

11. The method of claim 8, wherein the connecting the first component includes connecting the first component to the first circuit line such that the first component is exposed on the PCB and not embedded within the PCB,
the connecting the second component includes connecting the second component to the second circuit line such that the second component is exposed on the PCB and not embedded within the PCB.

12. The method of claim 8, wherein the PCB includes a plurality of signal layers and a plurality of ground layers, the first circuit line and the second circuit line being disposed on a signal layer from the plurality of signal layers.

13. The method of claim 8, wherein the recess is a first recess, the outer surface is a first outer surface, the signal layer is a first signal layer, the method further comprising:
forming a second recess in a second outer surface of the PCB opposite the first surface of the PCB, the PCB having a second signal layer different from the first signal layer, the second signal layer including a third circuit line having a first portion exposed within the second recess and a second portion exposed within the second recess, the second signal layer including a fourth circuit line having a first portion exposed within the second recess and a second portion exposed within the second recess;
connecting a third component within the second recess directly to the first portion of the third circuit line and the second portion of the third signal line, without a signal via; and
connecting a fourth component within the second recess directly to the first portion of the fourth circuit line and the second portion of the fourth circuit line, without a signal via,
the third component and the fourth component collectively defining a differential pair, a characteristic impedance mismatch associated with at least one of the third circuit line or the fourth circuit line being mitigated based on the third component and the fourth component being directly connected to third circuit line and the fourth circuit line, respectively,
at least a portion of the PCB connected to the third component and the fourth component being devoid of ground vias otherwise used to provide electromagnetic interference shielding for the differential pair.

14. The method of claim 8, wherein:
the first circuit line and the second circuit line are disposed on a first signal layer,
the PCB having a second signal layer, the second signal layer including at least one circuit line, the at least one circuit line of the second signal layer being routed independent from a routing of the first circuit line and the second circuit line on the first signal layer based at least in part on the first component and the second component being coupled to the first signal layer without the ground vias.

15. An apparatus, comprising:
a printed circuit board (PCB) formed from at least one low loss material associated with high-speed data transfer, the PCB having a recess in an outer surface of the PCB, the PCB including a transmission line having a first portion exposed within the recess and a second portion exposed within the recess;
a first capacitor disposed within the recess and directly connected to the first portion of the transmission line; and
a second capacitor disposed within the recess and directly connected to the second portion of the transmission line,
the first capacitor and the second capacitor collectively defining a differential pair directly connected to the transmission line between a source component and a destination component, the transmission line being devoid of electrical contact with a via between the source component and the destination component,
the differential pair modifying a characteristic impedance of the transmission line during high-speed data transfer based on the first capacitor and the second capacitor being directly connected to the transmission line.

16. The apparatus of claim 15, wherein:
the first portion of the transmission line is a first circuit line and the second portion of the transmission line is a second circuit line, the first circuit line and the second circuit line collectively perform differential signaling.

17. The apparatus of claim 15, wherein the first capacitor and second capacitor each is connected to the first portion and the second portion, respectively, of the transmission line without a signal via and without a ground via used to provide electromagnetic interference shielding, a portion of the PCB connected to the first capacitor and the second capacitor having a component density and a cross talk greater than and less than, respectively, a component density and a cross talk of a PCB including a pair of capacitors connected to a transmission line having ground vias used to provide electromagnetic interference shielding.

18. The apparatus of claim 15, wherein the first capacitor and the second capacitor each is connected to the first portion and the second portion, respectively, of the transmission line such that the first capacitor and the second capacitor each is exposed on the PCB and not embedded within the PCB.

19. The apparatus of claim 15, wherein the PCB includes a plurality of signal layers and a plurality of ground layers, the transmission line being disposed on a signal layer from the plurality of signal layers.

20. The apparatus of claim 15, wherein the at least one low loss material forming the PCB is at least one low loss material other than FR-4, the high-speed data transfer being at least 10 Gigabits per second (Gb/s).

* * * * *